(12) United States Patent
Kim et al.

(10) Patent No.: US 9,773,660 B2
(45) Date of Patent: Sep. 26, 2017

(54) WAFER PROCESSING METHODS

(71) Applicant: Samsung Electronics Co., Ltd., Suwon-si (KR)

(72) Inventors: Tae-yeong Kim, Suwon-si (KR); Pil-kyu Kang, Anyang-si (KR); Byung-lyul Park, Seoul (KR); Jin-ho Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 875 days.

(21) Appl. No.: 14/056,270

(22) Filed: Oct. 17, 2013

(65) Prior Publication Data

US 2014/0106649 A1  Apr. 17, 2014

(30) Foreign Application Priority Data

Oct. 17, 2012  (KR) .................. 10-2012-0115487

(51) Int. Cl.
| | |
|---|---|
| *H01L 21/02* | (2006.01) |
| *H01L 21/30* | (2006.01) |
| *H01L 21/68* | (2006.01) |
| *H01L 21/304* | (2006.01) |
| *H01L 21/683* | (2006.01) |

(52) U.S. Cl.
CPC ...... *H01L 21/02016* (2013.01); *H01L 21/304* (2013.01); *H01L 21/6835* (2013.01); *H01L 21/6836* (2013.01); *H01L 2221/6834* (2013.01); *H01L 2221/68327* (2013.01); *H01L 2221/68363* (2013.01); *H01L 2221/68381* (2013.01)

(58) Field of Classification Search
CPC ............................. B24B 9/065; B24B 37/042
USPC .................. 451/44, 28, 287–290, 54, 57, 58
See application file for complete search history.

(56) References Cited

U.S. PATENT DOCUMENTS

| | | | |
|---|---|---|---|
| 5,937,312 A | 8/1999 | Iyer et al. | |
| 6,113,721 A * | 9/2000 | Secco d'Aragona | ... B24B 9/065 156/154 |
| 6,910,403 B1 * | 6/2005 | Ishikawa | ............. H01L 21/6836 125/11.15 |
| 7,378,332 B2 | 5/2008 | Tomita et al. | |
| 2003/0190795 A1 * | 10/2003 | Kawakami | ............. H01L 21/56 438/462 |
| 2007/0148916 A1 * | 6/2007 | Noda | ..................... B24B 7/228 438/459 |
| 2009/0203167 A1 | 8/2009 | Mitani | |
| 2011/0097874 A1 | 4/2011 | Broekaart et al. | |
| 2011/0151644 A1 | 6/2011 | Vaufredaz | |
| 2011/0230005 A1 | 9/2011 | Vaufredaz et al. | |
| 2012/0122299 A1 | 5/2012 | Wang et al. | |

FOREIGN PATENT DOCUMENTS

| | | |
|---|---|---|
| JP | 11-016861 | 1/1999 |
| JP | 2012-059965 | 3/2012 |
| KR | 100327326 | 2/2002 |

* cited by examiner

*Primary Examiner* — Larry E Waggle, Jr.
*Assistant Examiner* — Lauren Beronja
(74) *Attorney, Agent, or Firm* — Myers Bigel, P.A.

(57) ABSTRACT

Wafer processing methods are provided. The methods may include cutting respective edges of a wafer and an adhesive a predetermined angle before grinding a back surface of the wafer.

20 Claims, 9 Drawing Sheets

WAFER PROCESSING METHODS

CROSS-REFERENCE TO RELATED APPLICATION

This U.S. non-provisional application claims priority under 35 U.S.C. §119 to Korean Patent Application No. 10-2012-0115487, filed on Oct. 17, 2012, in the Korean Intellectual Property Office, the disclosure of which is hereby incorporated by reference herein in its entirety.

FIELD

The present disclosure generally relates to the field of electronics.

BACKGROUND

To make portable electronic appliances, such as mobile phones or portable multimedia players (PMPs), compact and light, back-lap or back-grinding processes for wafers may be used. A back-grinding process may remove a portion of a back side of a wafer, on which side integrated circuits are not formed, to reduce a thickness of the wafer using a laser, chemical and/or mechanical polishing. After the back-grinding process, subsequent processes, such as attaching a circuit substrate, making electrical connections, sealing processes, forming input/output terminals, and sawing processes, may be performed to manufacture a semiconductor package including the wafer.

SUMMARY

A wafer processing method may include attaching a first wafer to a second wafer using an adhesive extending between the first wafer and the second wafer. A front surface of the first wafer may face the second wafer. The method may also include cutting respective edges of the first wafer, the adhesive and the second wafer at a predetermined angle with respect to a back surface of the first wafer opposite the front surface of the first wafer. A cut side of the first wafer may include a sloped side. The method may further include grinding the back surface of the first wafer.

According to various embodiments, the predetermined angle may be in a range of about 35° to about 45°.

In various embodiments, cutting the edges of the first wafer, the adhesive and the second wafer may include cutting an edge only in an upper half of the second wafer.

In various embodiments, grinding the back surface of the first wafer may include grinding the first wafer until a thickness of the first wafer becomes equal to or less than about 100 µm.

According to various embodiments, cutting the edges of the first wafer, the adhesive and the second wafer may be performed using a cutting bit having a tip in a shape corresponding to the predetermined angle.

In various embodiments, a thickness of the adhesive may be in a range of about 5 µm to about 200 µm.

According to various embodiments, cutting the edges of the first wafer, the adhesive and the second wafer may include cutting the edge of the first wafer to reduce a diameter of the back surface of the first wafer by at least about 1,000 µm.

According to various embodiments, the method may further include disposing wires on the back surface of the first wafer and arranging bumps on the respective wires after grinding the back surface of the first wafer.

In various embodiments, the method may further include separating the first wafer from the adhesive after arranging the bumps.

In various embodiments, the adhesive may be under a peripheral portion of the first wafer to support the first wafer during grinding of the back surface of the first wafer.

In various embodiments, a cut side of the adhesive may include a sloped side exposed by the first wafer.

A wafer processing method may include attaching a device wafer to a carrier wafer using an adhesive. The device wafer may include integrated circuits on a front surface thereof and the front surface of the device wafer may face the carrier wafer. The method may also include cutting respective edges of the adhesive and the device wafer at an angle in a range of about 35° to about 45° with respect to a back surface of the device wafer opposite the front surface of the device wafer. An external angle between the back surface of the device wafer and a cut side of the device wafer may be an acute angle. The method may further include grinding the back surface of the device wafer.

According to various embodiments, cutting the edges of the adhesive and the device wafer may not cut an edge of the carrier wafer.

According to various embodiments, cutting the edges of the adhesive and the device wafer further may include cutting an edge of the carrier wafer. A cut side of the carrier wafer may have an angle different from an angle of a cut side of the device wafer.

In various embodiments, cutting the edges of the adhesive and the device wafer may include cutting the edge of the device wafer to reduce a diameter of the back surface of the device wafer by at least about 1,000 µm. Grinding the back surface of the device wafer may include grinding the device wafer until a thickness of the device wafer becomes equal to or less than about 100 µm.

A wafer processing method may include removing an edge of a wafer assembly including a carrier wafer, a device wafer and an adhesive between the carrier wafer and the device wafer. Removing the edge of the wafer assembly may include removing respective edges of the device wafer and the adhesive, making a width of the device wafer smaller than a width of the carrier wafer and forming a slope in a cut side of the device wafer. The device wafer may include a first surface including integrated circuits thereon and may face the carrier wafer and a second surface opposite the first surface. The method may also include grinding the second surface of the device wafer after removing the edge of the wafer assembly and separating the device wafer from the adhesive after grinding the second surface of the device wafer.

According to various embodiments, the adhesive may include ultraviolet (UV) cure resin, UV cure resist, thermoset resin, thermoplastic resin, resin, ceramic, polydimethylsiloxane (PDMS), polar solvent N-methylpyrrolidone (NMP), propylene glycol methyl ether acetate (PGMEA) or butyrolactone (BLO).

In various embodiments, the slope may include a first slope and removing the edge of the wafer assembly may form a second slope in a cut side of the adhesive.

According to various embodiments, the first slope may include a first angle different from a second angle of the second slope.

In various embodiments, the slope may include an angle in a range of about 35° to about 45°.

DETAILED DESCRIPTION

Figure 1:
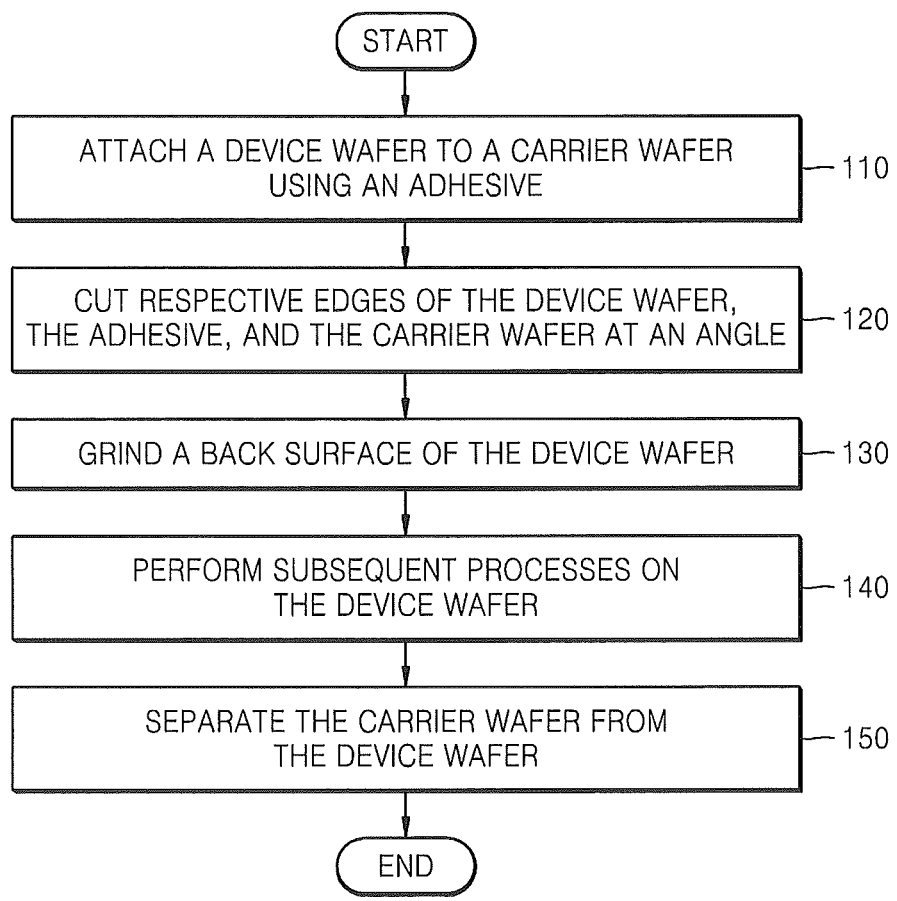
FIG. 1 is a flowchart illustrating a wafer processing method according to some embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of the example embodiments. As such, variations from the shapes of the illustrations as a result, for example, of manufacturing techniques and/or tolerances, are to be expected. Thus, the example embodiments of the inventive concepts should not be construed as limited to the particular shapes illustrated herein but include deviations in shapes that result, for example, from manufacturing.

Unless otherwise defined, all terms, including technical and scientific terms, used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concepts.

A back-grinding process may cause damage on a device wafer including integrated circuits during the grinding process or subsequent processes. To reduce damage on the device wafer, an edge of the device wafer may be removed before attaching the device wafer to a carrier wafer using an adhesive. As appreciated by the present inventive entity, however, removing the edge of the device wafer before attaching the device wafer to the carrier wafer using the adhesive may expose a large portion of the adhesive, which may cause contamination during subsequent processes. Also, the exposed portion of the adhesive may form an undercut when the adhesive is removed and the undercut may make the edge of the device wafer weak. Various embodiments of the present inventive concepts, however, provide wafer processing methods where edges of a device wafer and an adhesive are removed after attaching the device wafer to a carrier wafer. Accordingly, the wafer processing methods described herein may reduce damage to the device wafer and may reduce contamination due to the adhesive.

FIG. 1 is a flowchart illustrating a wafer processing method according to some embodiments of the present inventive concepts. Referring to FIG. 1, a device wafer may be attached to a carrier wafer (Block 110). The device wafer may include integrated circuits and a thickness of the device wafer may be reduced through a grinding process. The device wafer may include a front surface, which is an active surface including integrated circuits, and a back surface opposite the front surface. The front surface of the device wafer may face the carrier wafer. The back surface of the device wafer may be grinded until the thickness becomes a predetermined thickness.

In some embodiments, a through electrode, for example, a through silicon via (TSV), may be formed in the device wafer. The through electrode may function as an electrical connecting wire when a semiconductor package including the device wafer is stacked on other semiconductor packages.

The carrier wafer is a wafer supporting the device wafer and may include quartz, glass, semiconductor, ceramic, or metal. The carrier wafer may include a rigid material and may have sufficient mechanical strength. Thus, where the thickness of the device wafer is decreased through the grinding process after the carrier wafer is coupled to the device wafer, the device wafer may be easily handled because the carrier wafer may firmly support the device wafer.

The thickness of the carrier wafer may be about 100 μm to about 1,000 μm. However, the thickness of the carrier wafer is not limited thereto. That is, the thickness of the carrier wafer may be smaller than about 100 μm or greater than about 1,000 μm. The size of the carrier wafer may be substantially the same as that of the device wafer. Specifically, the diameter of the carrier wafer may be substantially the same as that of the device wafer. For example, the diameters of both the carrier wafer and the device wafer may be 300 mm. The diameters of the carrier wafer and the device wafer are not limited thereto, however.

The device wafer is attached to the carrier wafer using an adhesive, which may include a polymer material with adhesive property. The adhesive may be a liquid-type material and may include an ultraviolet (UV) cure resin or resist, a solid film type, thermoset resin, thermoplastic resin, paste resin, film, ceramic, or polydimethylsiloxane (PDMS). An adhesive including a UV cure resin or resist may make separating the carrier wafer from the device wafer easy, because an adhesion strength of such an adhesive may become weak if heat is applied through a laser.

In some embodiments, laser-removable adhesives that can be removed with a laser may be used to attach the device wafer to the carrier wafer. The laser-removable adhesives may be removed by laser ablation. Specifically, the laser-removable adhesive may be an adhesive including polar solvent N-methylpyrrolidone (NMP), or an adhesive including propylene glycol methyl ether acetate (PGMEA) and butyrolactone (BLO).

An adhesive may be applied on the carrier wafer or the device wafer by, for example, spin coating, roller coating, flow coating, painting or spraying.

After the device wafer is attached to the carrier wafer, edges of the device wafer, the adhesive, and the carrier wafer may be cut at an angle (Block 120). That is, an edge of the device wafer may be cut such that the external angle between the back surface of the device wafer and the cut side of the device wafer is an acute angle. In this case, the cutting may be performed at one time with respect to the device wafer, the adhesive, and the carrier wafer and thus the cut sides of the device wafer, the adhesive and the carrier wafer may be on the same plane. In this case, an external angle between the back surface and cut side of the device wafer after cutting may be about 35° to about 45°.

In some embodiments, for the carrier wafer, only its edge that lies above its center of thickness may be cut, and its side below its center of thickness may still have a round shaped side. Thus, the carrier wafer may maintain a large/maximum horizontal sectional area at its center of thickness. That is, the large/maximum horizontal sectional area of the carrier wafer may not decrease through the cutting process. The cutting process is described in more detail herein.

After performing the cutting process on the edges, a grinding process may be performed on the back surface of the device wafer (Block 130). In some embodiments, the grinding process may be implemented by, for example, a polishing process. Through the grinding process, a thickness of the device wafer may decrease to a desired thickness. For example, through the grinding process, the thickness of the device wafer may be about 100 μm.

In some embodiments, the thickness of the device wafer may be about 50 μm or less after the grinding process. For example, after the grinding process, the thickness of the device wafer may be about 10 μm to about 30 μm. If the device wafer includes a through electrode, a part of the through electrode may be exposed to the back surface of the device wafer after the grinding process.

During a grinding process using a polishing process, the carrier wafer may be fixed to a chuck table for polishing using a polishing tape or a back-lap tape, and thus the device wafer attached to the carrier wafer may also be fixed to the chuck table.

After the grinding process is performed on the back surface of the device wafer, subsequent processes may be performed on the device wafer (Block 140). The subsequent processes on the device wafer may include processes of arranging wires, pads, and bumps on the back surface of the polished device wafer. For example, if the device wafer includes a through electrode, the wires and pads connected to the through electrode may be arranged and bumps may be arranged on the pads.

After the subsequent processes are performed, the carrier wafer and the adhesive may be separated from the device wafer (Block 150). Separating the carrier wafer and the adhesive may be performed after a tape mount process on the device wafer or after a process of transferring the device wafer to another support wafer. That is, since the device wafer becomes very thin through the grinding process, it may be difficult to handle the device wafer after the carrier wafer is removed. Thus, separating the carrier wafer and the adhesive may be performed after fixing the device wafer to another support.

A wafer processing method according to some embodiments may minimize or reduce damage to the device wafer, such as chipping, cracks, or breaking during the grinding and subsequent processes, by attaching the device wafer to the carrier wafer and cutting the edges of the device wafer, adhesive, and carrier wafer at a predetermined angle. In addition, contamination due to the adhesive may be reduced during the grinding and subsequent processes as well.

More specifically, the device wafer may be attached to the carrier wafer and then an edge of the device wafer may be cut at an angle to make the device wafer smaller than the carrier wafer. Therefore, external shock applied to the edge of the device wafer during the grinding and subsequent processes may be minimized or reduced and thus damage to the device wafer may be minimized or reduced. In addition, since a only small portion of the adhesive may protrude as a result of the inclined cutting, contamination due to the adhesive may also be reduced during the grinding and subsequent processes. Further, since the adhesive remaining under the edge of the device wafer may support a peripheral portion of the device wafer during the grinding process, it is possible to reduce damage to the device wafer.

FIGS. 2A to 2E are cross-sectional views illustrating a wafer processing method according to some embodiments of the present inventive concepts. FIG. 2A, FIG. 2B, FIG. 2C, FIG. 2D, and FIG. 2E may correspond to Block 110, Block 120, Block 130, Block 140, and Block 150, respectively.

Figure 2A:
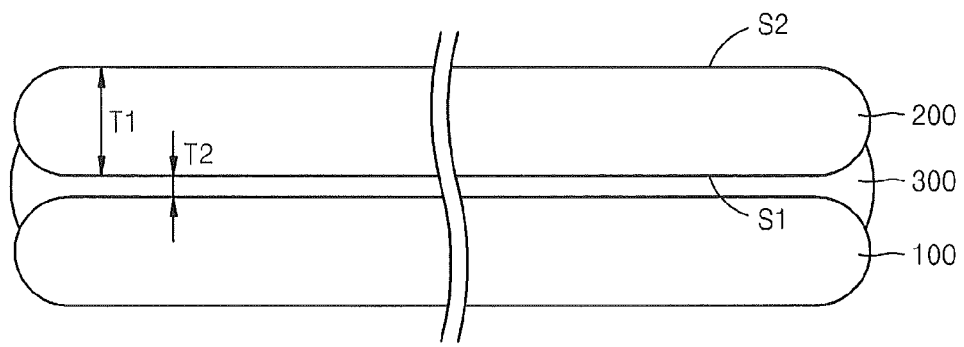
FIGS. 2A to 2E are cross-sectional views illustrating a wafer processing method according to some embodiments of the present inventive concepts.

Referring to FIG. 2A, a device wafer 200 is attached to a carrier wafer 100 using an adhesive 300. The carrier wafer 100 may support the device wafer 200 and may include quartz, glass, semiconductor, ceramic, or metal. In some embodiments, the carrier wafer 100 may be a semiconductor substrate, for example, a silicon wafer. As illustrated, a side of the carrier wafer 100 may have a round shape.

The device wafer 200 may include integrated circuits on a front surface S1 and the front surface S1 may be attached to the carrier wafer 100 using the adhesive 300. Thus, a back surface S2 of the device wafer 200 may be exposed and may face upward. A thickness T1 of the device wafer 200 before a grinding process may be about 700 μm to about 800 μm. The thickness T1 of the device wafer 200 before the grinding process is not limited thereto, however. In some embodiments, a side of the device wafer 200 may have a round shape similar to the carrier wafer 100.

The adhesive 300 may include a polymer material with an adhesive property. For example, the adhesive 300 may be a liquid-type material and may include UV cure resin or resist. The adhesive 300 may be easily separated from the device wafer 200 through UV laser irradiation. The adhesive 300 may be between the carrier wafer 100 and the device wafer 200 and may partially cover the sides of the carrier wafer 100 and the device wafer 200. A thickness T2 of the adhesive 300 may be about 5 μm to about 200 μm. In some embodiments, the thickness T2 of the adhesive 300 may be about 50 μm to about 120 μm. However, the thickness of the adhesive 300 is not limited thereto.

Figure 2B:
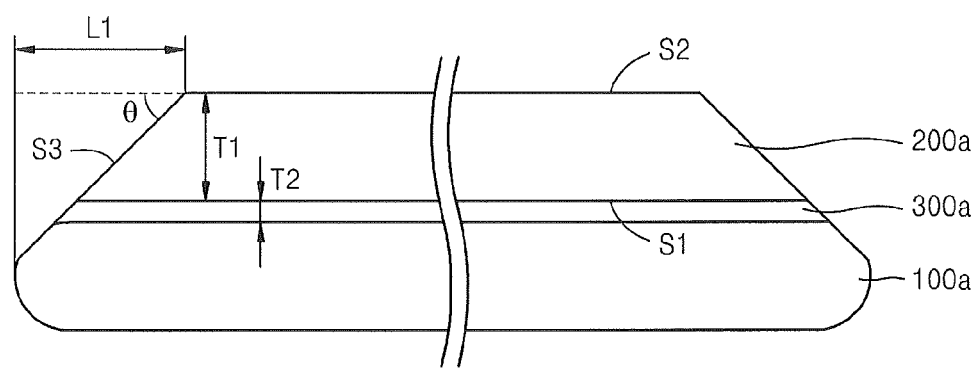

Referring to FIG. 2B, the edges of the carrier wafer 100a, the adhesive 300a, and the device wafer 200a are cut at an angle. That is, the edges are cut so that an external angle θ between the back surface S2 and the cut side S3 of the device wafer 200a may be an acute angle. The external angle θ may be, for example, about 35° to about 45°. The external angle θ may also correspond to a cutting angle that is later described in FIGS. 3A and 3B. Cutting may be concurrently performed on the device wafer 200a, the adhesive 300a, and the carrier wafer 100a. Thus, the cut sides of the device wafer 200a, the adhesive 300a, and the carrier wafer 100a may be on the same plane.

In addition, through the inclined cutting of the edges, the size of the device wafer 200a may become smaller than that of the carrier wafer 100a. For example, the back surface S2 of the device wafer 200a after cutting may decrease by a first length L1. For example, the first length L1 may be at least about 500 μm. Thus, a diameter of the back surface of the device wafer 200a may decrease by about 1,000 μm through cutting.

In some embodiments, only an edge of the upper half of the carrier wafer 100a, which is above its center of its thickness, may be cut and a side below the center of its thickness may maintain a round shape. In this case, the center of thickness is a position corresponding to a half of a total thickness of the carrier wafer 100a and corresponds to the center lines CL of FIGS. 3A and 3B. The carrier wafer 100a may have a maximum horizontal sectional area at the center of its thickness. Thus, due to the inclined cutting, a large/maximum horizontal sectional area of the carrier wafer 100a may be maintained.

In some embodiments, the carrier wafer 100a may have the maximum horizontal sectional area at parts other than at the center of its thickness, depending on the situation. If the carrier wafer 100a has the maximum horizontal sectional area at parts other than the center of its thickness, the descriptions above may be applied to the parts other than the center of thickness at which the carrier wafer has the maximum horizontal sectional area. That is, only the edge over the maximum horizontal sectional area may be cut and a side below the maximum horizontal sectional area may maintain a round shape.

Since the size of the device wafer 200a becomes smaller than that of the carrier wafer 100a through the inclined cutting, external shock applied to the edge of the device wafer 200a in subsequent processes including the grinding may be minimized or reduced and thus damage to the device wafer 200a may also be minimized or reduced. In addition, since a small portion of the adhesive 300a may be exposed as a result of the inclined cutting, contamination due to the adhesive may be reduced during subsequent processes. Further, since the adhesive 300a remaining under the outermost part of the front surface S1 of the device wafer 200a may firmly support the outermost part of the device wafer 200a during the grinding process, it is possible to reduce damage to the device wafer.

Figure 2C:
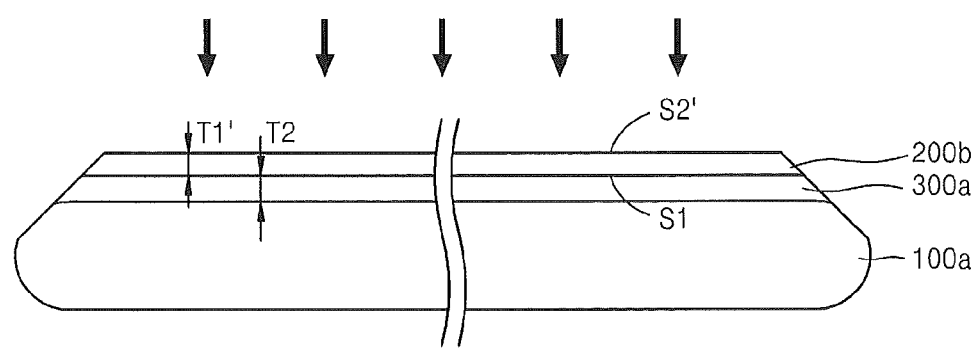

Referring to FIG. 2C, a back surface S2' of the device wafer 200b may be exposed after a predetermined portion of the device wafer 200b is removed through a grinding process. That is, the grinding process may be performed in the direction as indicated by arrows to decrease the thickness of the device wafer 200b. For example, the thickness T1' of the device wafer 200b after the grinding process may be about 100 μm or less. In some embodiments, the thickness T1' of the device wafer 200b after the grinding process may be about 50 μm or less. For example, the thickness T1' of the device wafer 200b may be about 10 μm to about 30 μm.

Figure 2D:
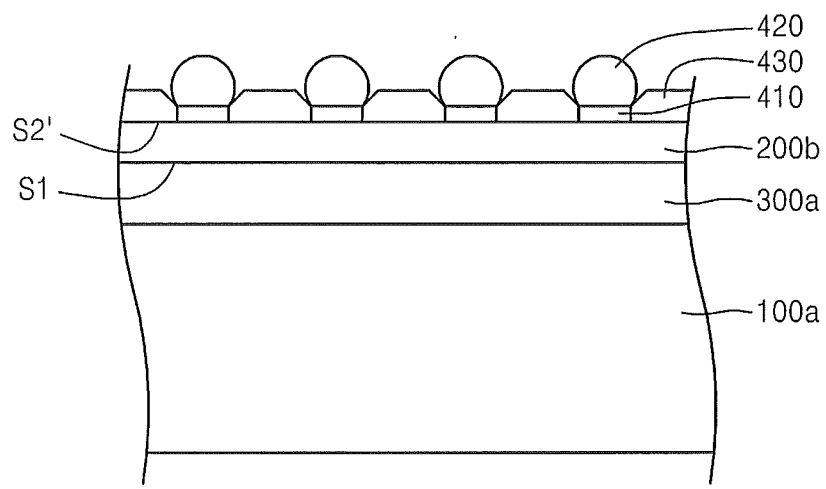

Referring to FIG. 2D, pads 410 may be disposed on the back surface S2' of the device wafer 200b and bumps 420 may be disposed on the pads 410. The pads 410 may be connected to the through electrodes in the device wafer 200b through wires disposed on the back surface S2'. In this case, a passivation film 430 may cover the wires disposed on the back surface S2' of the device wafer 200b. In general, subsequent processes may be performed on the device wafer 200b after the grinding process. The subsequent processes may include, for example, disposing the wires and the pads 410 on the back surface S2' of the device wafer 200b and arranging the bumps 420 on the pads 410 as described herein.

Figure 2E:
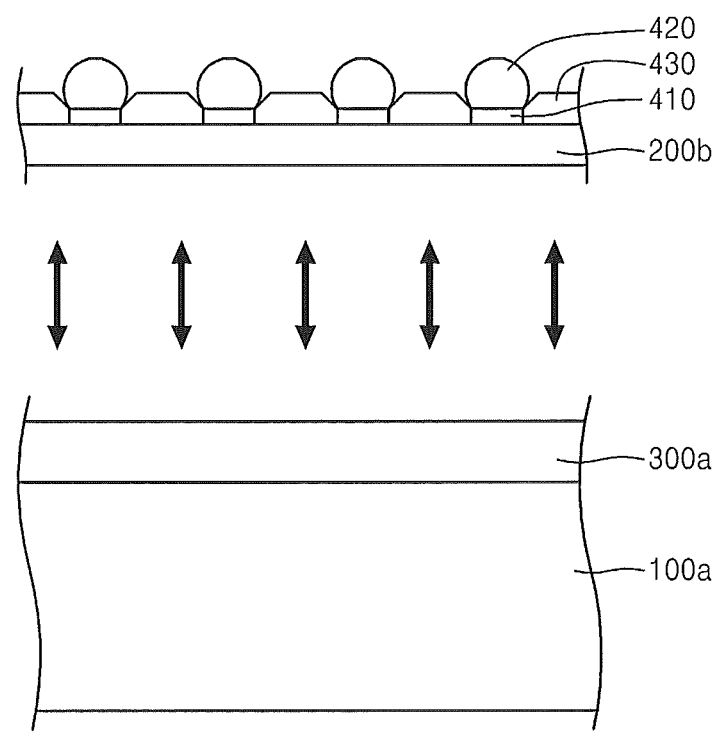

Referring to FIG. 2E, the carrier wafer 100a and the adhesive 300a may be separated from the device wafer 200b. Separating the carrier wafer 100a and the adhesive 300a may be performed through UV laser irradiation. That is, an adhesion strength of the adhesive becomes weak by heat applied to the adhesive using UV lasers and thus the carrier wafer 100a and the adhesive 300a may be easily separated from the device wafer 200b. In some embodiments, the adhesive 300a may be wholly or partially removed through laser ablation, and thus the carrier wafer 100a may be separated from the device wafer 200b. In addition, various other separating methods may be used, such as thermal, laser, chemical, or mechanical methods.

In some embodiments, the carrier wafer 100a may be specially coated so as not to be damaged by laser heat. The carrier wafer 100a might not be discarded after the separation but may be reused in other grinding processes.

Although FIG. 2E illustrates that the carrier wafer 100a and the adhesive 300a are separated while the device wafer 200b is not coupled to other supports, the device wafer 200b may be coupled to other supports before separation. That is, since the device wafer 200b may be very thin after the grinding process, it may be very difficult to handle the device wafer 200b itself. Thus, the device wafer 200b may be coupled to other supports, and then the carrier wafer 100a and the adhesive 300a may be separated from the device wafer 200b. For example, after a tape mount process is performed on the device wafer 200b or the device wafer 200b is transferred and coupled to other supports, the carrier wafer 100a and the adhesive 300a may be separated from the device wafer 200b.

Figure 3A:
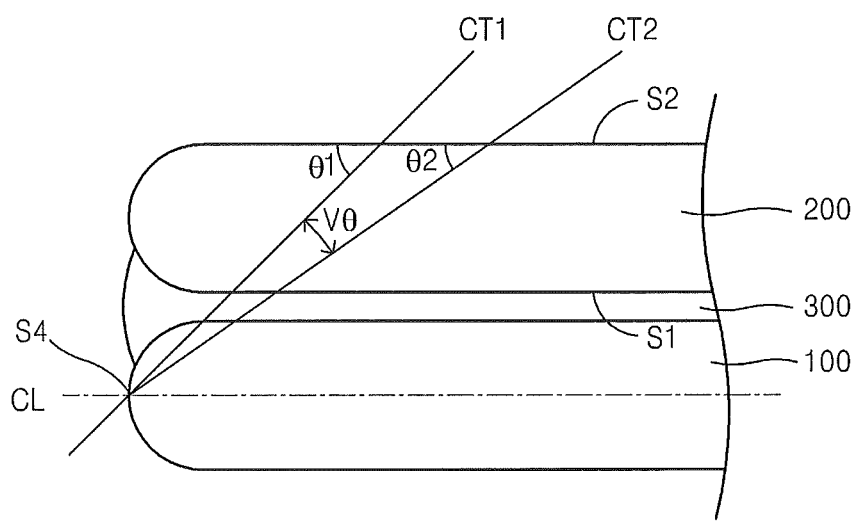
FIGS. 3A and 3B are cross-sectional views illustrating edges of a device wafer, an adhesive and a carrier wafer according to some embodiments of the present inventive concepts.
Figure 3B:
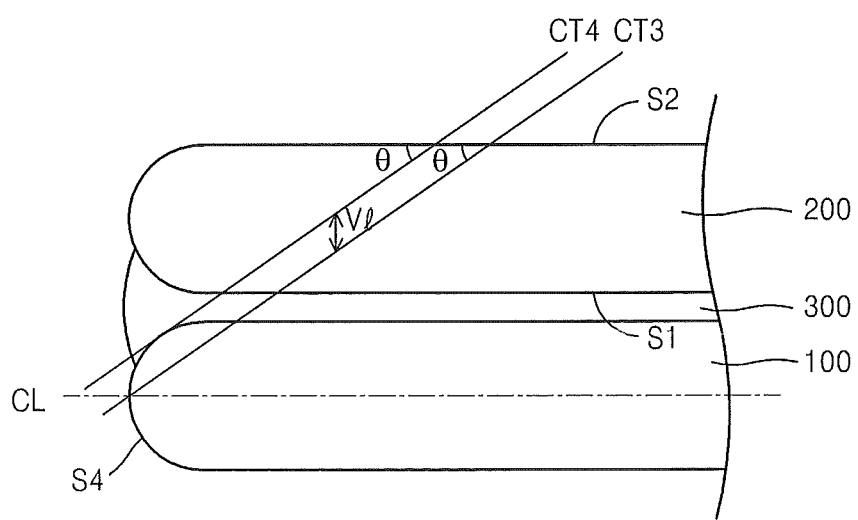

FIGS. 3A and 3B are cross-sectional views illustrating edges of a device wafer, an adhesive and a carrier wafer according to some embodiments of the present inventive concepts. Referring to FIG. 3A, the device wafer 200 is attached to the carrier wafer 100 and then the cutting process may be performed on the edges as described herein. In some embodiments, the cutting process may be performed at a cutting angle within a predetermined range. The center line CL is a line where the carrier wafer 100 has a maximum horizontal sectional area, and may be a line corresponding to the center of thickness, as described herein.

The cutting process may be performed between a first cutting line CT1 with a first cutting angle $\theta 1$ and a second cutting line CT2 with a second cutting angle $\theta 2$. In this case, the first cutting angle $\theta 1$ is an external angle between the cutting line CT1 and the back surface S2 of the device wafer 200, and the second cutting angle $\theta 2$ is an external angle between the cutting line CT2 and the back surface S2 of the device wafer 200. In addition, the cutting line CT1 and the cutting line CT2 may pass a point where the center line CL meets the side S4 of the carrier wafer 100 at the first cutting angle $\theta 1$ or the second cutting angle $\theta 2$, respectively, with respect to the back surface S2 of the device wafer 200.

In some embodiments, the first cutting angle $\theta 1$ may be about 45° and the second cutting angle $\theta 2$ may be about 35°. Thus, a variable angle $V\theta$ between the first cutting angle $\theta 1$ and the second cutting angle $\theta 2$ may be about 10° (=45°−35°). In the cutting process, an appropriate cutting angle between the first cutting angle $\theta 1$ and the second cutting angle $\theta 2$ may be determined by considering the thicknesses of the carrier wafer 100, the adhesive 300, and the device wafer 200.

Referring to FIG. 3B, the cutting angle $\theta$ may be fixed and only the cutting line may move up and down. That is, a third cutting line CT3 may pass a point where the center line CL meets the side S4 of the carrier wafer 100 at the fixed angle $\theta$ with respect to the back surface S2 of the device wafer 200. A fourth cutting line CT4 may pass a point of the side S4 of the carrier wafer 100 at the fixed angle $\theta$ with respect to the back surface S2 of the device wafer 200.

A variable length Vl between the third cutting line CT3 and the fourth cutting line CT4 may vary depending on the thickness of the carrier wafer 100 or a shape or curvature of the side of the carrier wafer 100. In the cutting process, an appropriate cutting line between the cutting line CT3 and the cutting line CT4 may be determined by considering the thicknesses of the carrier wafer 100, the adhesive 300, and the device wafer 200.

Figure 4:
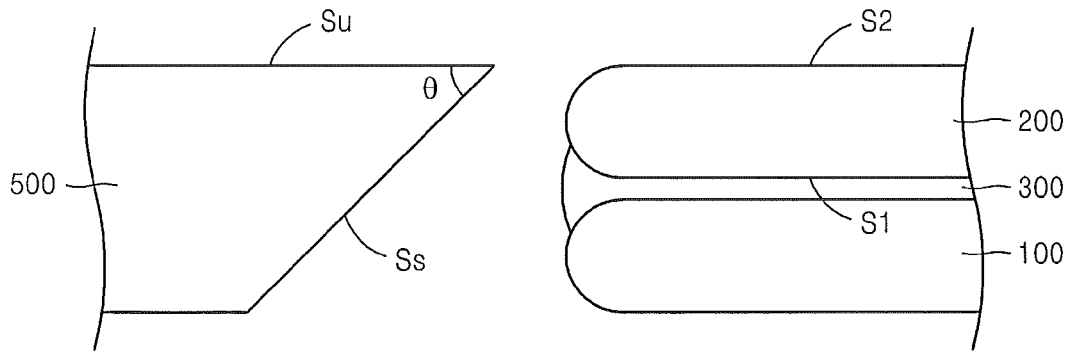
FIG. 4 is a cross-sectional view illustrating a cutting process using a cutting bit according to some embodiments of the present inventive concepts.

FIG. 4 is a cross-sectional view illustrating a cutting process using a cutting bit according to some embodiments of the present inventive concepts. Referring to FIG. 4, the cutting process of cutting the edges of the carrier wafer 100, the adhesive 300 and the device wafer 200 may be performed using a cutting bit 500. The end of the cutting bit 500, the tip, may have an angle $\theta$ that corresponds to a cutting angle to be made on the edge of the device wafer 200. For example, an internal angle $\theta$ between the top Su and the side Ss of the cutting bit 500 may be the same as the cutting angle to be made on the edge of the device wafer 200. The cutting bit 500 may cut the edges of the carrier wafer 100, the adhesive 300, and the device wafer 200, by rotating in a circumferential direction. Thus, the cut side may be formed on the edges of the carrier wafer 100, the adhesive 300, and the device wafer 200 as illustrated in FIG. 2B.

A method of cutting the edge of the device wafer 200 using a cutting bit is provided as an example and some embodiments may use different processes. That is, the cutting method according to some embodiments may include different mechanical methods that may perform the inclined cutting on edges at a predetermined angle while the device wafer 200 is attached to the carrier wafer 100 using the adhesive 300. For example, the inclined cutting may be performed on edges by using blades or lasers. In some embodiments, the inclined cutting may be performed by etching processes.

Figure 5:
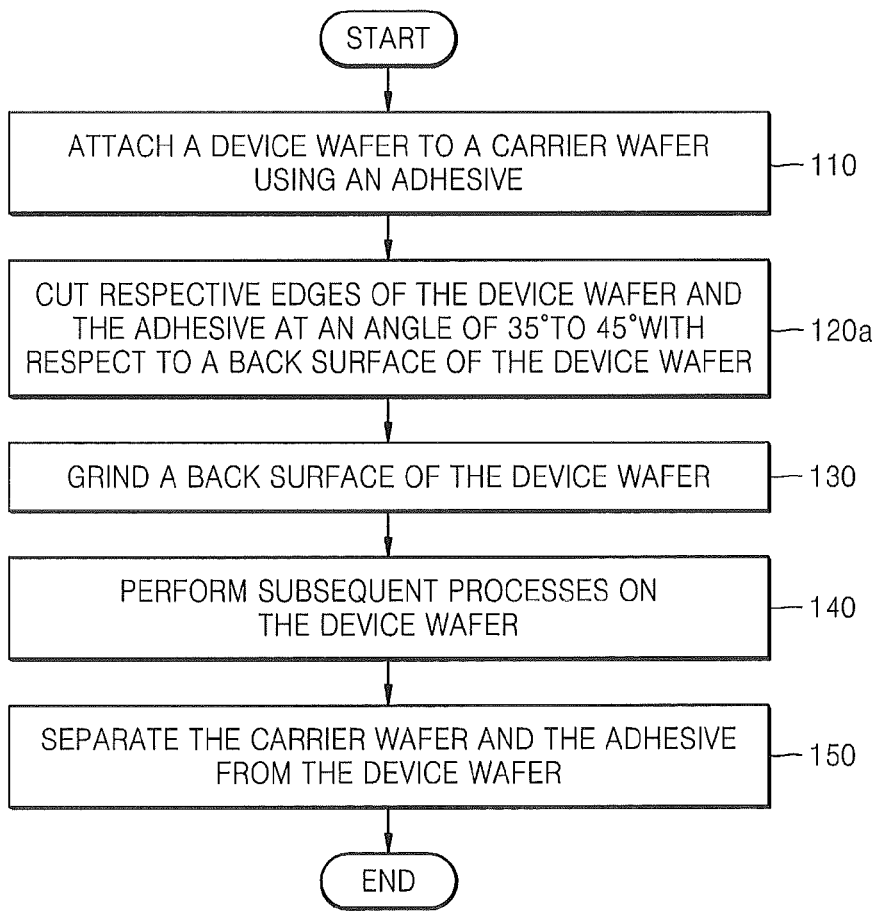
FIG. 5 is a flowchart illustrating a wafer processing method according to some embodiments of the present inventive concepts.

FIG. 5 is a flowchart illustrating a wafer processing method according to some embodiments of the present inventive concepts. Referring to FIG. 5, a device wafer is attached to a carrier wafer using an adhesive (Block 110). Then, edges of the device wafer and the adhesive are cut at an angle of about 35° to about 45° with respect to back surface of the device wafer (Block 120a). In this case, the angle may be an external angle between the cut side and the back surface of the device wafer after cutting.

In some embodiments, the edge of the carrier wafer might not be cut or may be cut through a separate cutting process. Regarding this, descriptions are made in more detail in FIGS. 6A to 6D.

The edges of the device wafer and the adhesive may be cut at an angle of about 35° to about 45°, and then the back surface of the device wafer is grinded (Block 130). The device wafer may have a thickness, for example, of about 10 μm to about 30 μm after the grinding process.

After the grinding process, subsequent processes may be performed on the device wafer (Block 140). The subsequent processes on the device wafer may include disposing wires, disposing pads and arranging bumps on the back surface of the device wafer, for example.

After the subsequent processes on the device wafer, the carrier wafer and the adhesive may be separated from the device wafer (Block 150). As described herein, various methods may be used for separation, such as UV laser irradiation, laser ablation, thermal, chemical, and mechanical methods.

Figure 6A:
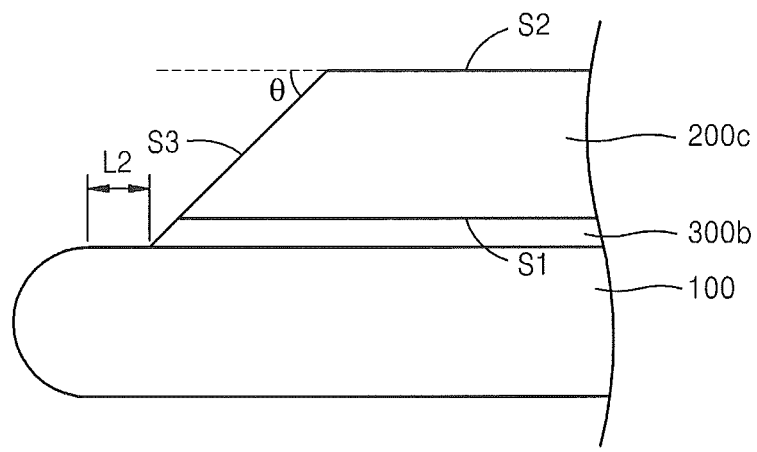
FIGS. 6A to 6D, are cross-sectional views illustrating edges of a device wafer, an adhesive and a carrier wafer according to some embodiments of the present inventive concepts.

FIGS. 6A to 6D are cross-sectional views illustrating edges of a device wafer, an adhesive and a carrier wafer according to some embodiments of the present inventive concepts. Referring to FIG. 6A, a cutting process may not cut an edge of the carrier wafer 100. Thus, the cutting process may be performed only on edges of the device wafer 200c and the adhesive 300b. Through the cutting process, an external angle $\theta$ between the cut side S3 of the device wafer 200c and the adhesive 300b and a back surface S2 of the device wafer 200c may have a predetermined angle. For example, the external angle $\theta$ may be in a range of about 35° to about 45°

In some embodiments, the cut side S3 of the device wafer 200c and the adhesive 300b may meet an upper surface of the carrier wafer 100 at a predetermined location. The predetermined location may be spaced apart from a point where a round side of the carrier wafer 100 meets with the upper surface thereof by a second length L2.

Since the carrier wafer 100 not cut may support the device wafer 200c during a grinding process and subsequent processes, in some embodiments the inclined cutting may not be performed on an edge of the carrier wafer 100. When the carrier wafer 100 is not cut, the carrier wafer 100 is larger than the device wafer 200c. In other words, the device wafer 200c may become smaller than the carrier wafer 100 due to the inclined cutting of the edges of the device wafer 200c and the adhesive 300b, and thus external shock applied to the edge of the device wafer 200c during the grinding and subsequent processes may be minimized or reduced and damage to the device wafer 200c may be minimized or reduced as well.

Figure 6B:
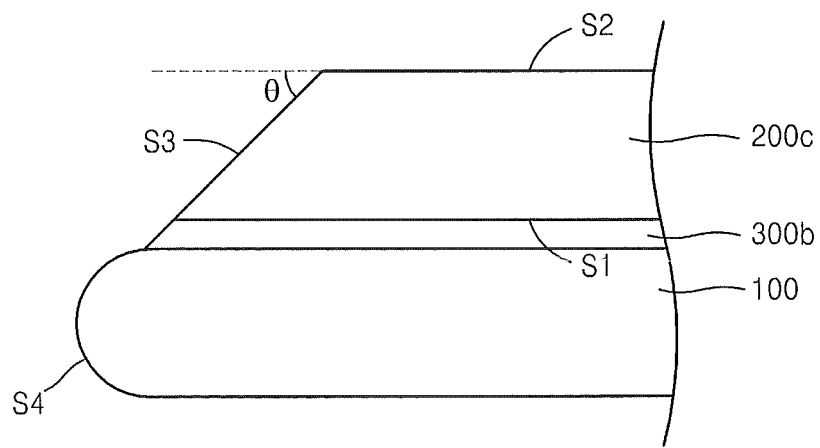

The cutting process in FIG. 6B may be similar to that of FIG. 6A. In the cutting process of FIG. 6A, the cut side S3 of the device wafer 200c and the adhesive 300b meets a part of the carrier wafer 100 spaced apart by the second length L2 from where the round side S4 of the carrier wafer 100 meets the top thereof. However, in FIG. 6B the cut side S3 of the device wafer 200c and the adhesive 300b may meet an upper surface of the carrier wafer at a location where the side S4 of the carrier wafer 100 meets the upper surface thereof.

While the device wafer 200c of FIG. 6B maintains a smaller size than that of the carrier wafer 100, it may be larger than the device wafer 200c of FIG. 6A. Thus, the device wafer 200c of FIG. 6B may have larger usable area but may minimize or reduce damage to the device wafer 200c and contamination due to the adhesive 300b as well.

Cutting only the edges of the device wafer 200c and the adhesive 300b as described in FIGS. 6A and 6B may be performed by control of a position of the cutting bit 500 in FIG. 4. The cutting may be performed after positioning the cutting bit 500 such that the lower surface of the cutting bit 500 is aligned to a top surface of the carrier wafer 100.

Figure 6C:
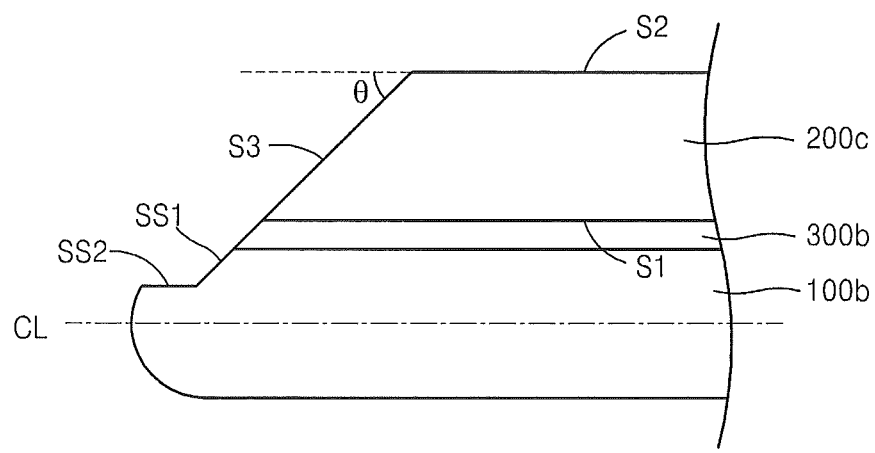

Referring to FIG. 6C, the edge of the carrier wafer 100b may be cut, unlike embodiments in FIGS. 6A and 6B. The edge of the carrier wafer 100b may be cut in a shape different from those of FIGS. 3A and 3B.

More specifically, the carrier wafer 100b may include an edge side SS1 that is on the same plane as the cut side S3 of the device wafer 200c and the adhesive 300b, and an edge plane SS2 that is parallel to the back surface S2 of the device wafer 200c. As illustrated, the edge plane SS2 may be over the center line CL. Thus, the large/maximum horizontal sectional area of the carrier wafer 100b may be maintained.

Cutting the edges of the carrier wafer 100b, the adhesive 300b, and the device wafer 200c may also be performed by the appropriate adjustment of the position of the cutting bit 500 illustrated in FIG. 4. For example, cutting may be performed after positioning the cutting bit 500 such that the lower surface of the cutting bit 500 is aligned to an upper surface of the edge plane SS2 of the carrier wafer 100.

Figure 6D:
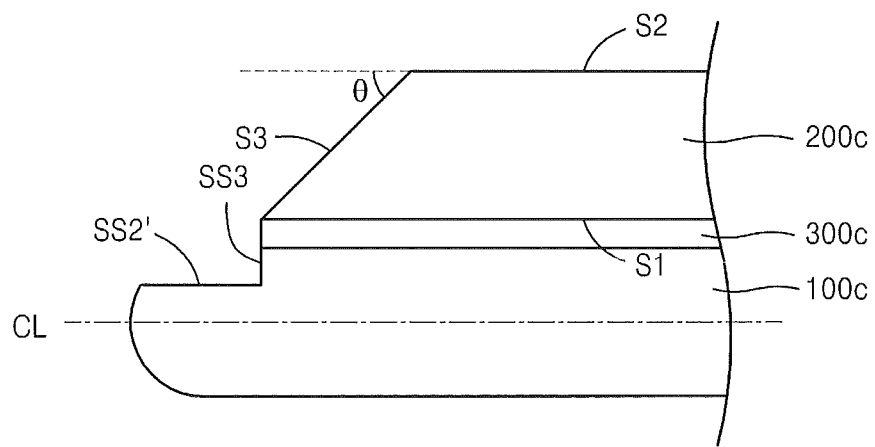

Referring to FIG. 6D, the cutting process may be similar to that of FIG. 6C in that a part of the edge of the carrier wafer 100c is cut. However, a structure of the carrier wafer 100c formed by the cutting process may be different from that of FIG. 6C. That is, the carrier wafer 100c may include a vertical edge side SS3 perpendicular to the back surface S2 of the device wafer 200c instead of the edge side SS1 that is on the same plane with respect to the cut side S3 of the device wafer 200c and the adhesive 300b.

The carrier wafer 100c may include an edge plane SS2' that is parallel to the back surface S2 of the device wafer 200c, as in FIG. 6C. However, if the size and cutting angle of the device wafer 200c are the same, the edge plane SS2' may be wider than the edge plane SS2 of FIG. 6C, due to the structure of the edge side SS3.

In some embodiments, cutting the edges of the carrier wafer 100c, the adhesive 300c, and the device wafer 200c may be performed using two separate cutting bits. For example, the cutting may be performed through two cutting processes using a first cutting bit with an inclined tip and a second cutting bit with a tip corresponding to the SS3 of the carrier wafer 100c.

Figure 7A:
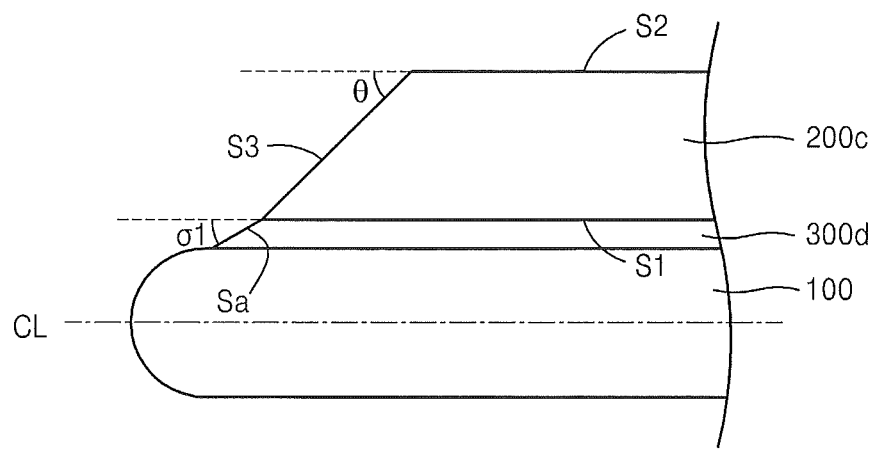
FIGS. 7A to 7D are cross-sectional views illustrating edges of a device wafer, an adhesive and a carrier wafer according to some embodiments of the present inventive concepts.

FIGS. 7A to 7D are cross-sectional views illustrating edges of a device wafer, an adhesive and a carrier wafer according to some embodiments of the present inventive concepts. Referring to FIG. 7A, a cut side Sa may not be on the same plane with respect to the cut side S3 of the device wafer 200c. That is, a first external angle θ between the cut side S3 and the back surface S2 of the device wafer 200c may be different from a second external angle σ1 between the cut side Sa of adhesive 300d and the back surface S2 of the device wafer 200c. For example, the first external angle θ may be greater than the second external angle σ1.

The adhesive 300d that attaches the device wafer 200c to the carrier wafer 100 may support the device wafer 200c along with the carrier wafer 100 during a grinding process and subsequent processes. However, the adhesive 300d exposed by the device wafer 200c and the carrier wafer 100 may cause semiconductor device defects if it protrudes too much because the adhesive 300d may be a contaminant during the grinding and subsequent processes. The adhesive 300d illustrated in FIG. 7A, however, may sufficiently support the edge of the device wafer 200c and reduce contamination.

Since the second external angle σ1 is smaller than the first external angle θ in some embodiments, the adhesive 300d may have a structure which protrudes more to the outside compared to other embodiments. In addition, cutting the edge is performed only on the device wafer 200c and the adhesive 300d, not on the carrier wafer 100. Since the second external angle σ1 is different from the first external angle θ, inclined cutting may be performed on the edges of the device wafer 200c and the adhesive 300d, respectively, by using two different cutting bits.

Figure 7B:
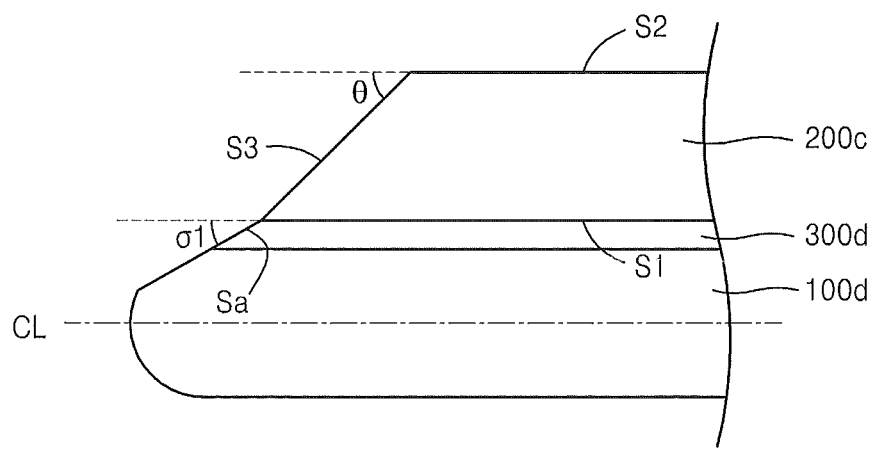

Referring to FIG. 7B, the edge of the device wafer 200c and the adhesive 300d may be cut at the first external angle θ greater than the second external angle σ1 as in FIG. 7A. However, the edge of the carrier wafer 100d may be cut. Cutting the edge of the carrier wafer 100d may be performed concurrently with cutting the edge of the adhesive 300d. Due to the cutting process, the cut side of the carrier wafer 100d and the cut side Sa of the adhesive 300d may be on the same plane.

When the device wafer, the adhesive, and the carrier wafer are concurrently cut at the first external angle θ using one cutting bit, the cutting may cut a portion of the carrier wafer 100 below the center line CL. A change in the size of the carrier wafer may mean, however, that a structure of a chuck table supporting the carrier wafer 100 may need to be changed in subsequent processes.

Thus, cutting the device wafer 200c at the first external angle θ and cutting the adhesive 300d and the carrier wafer 100d at the second external angle σ1 smaller than the first external angle θ may be used to reduce or prevent changing the size of the carrier wafer 100d. Other processes may be performed to cut the edges of the device wafer 200c at the first external angle θ and to cut the adhesive 300d the carrier wafer 100 at the second external angle σ1.

Figure 7C:
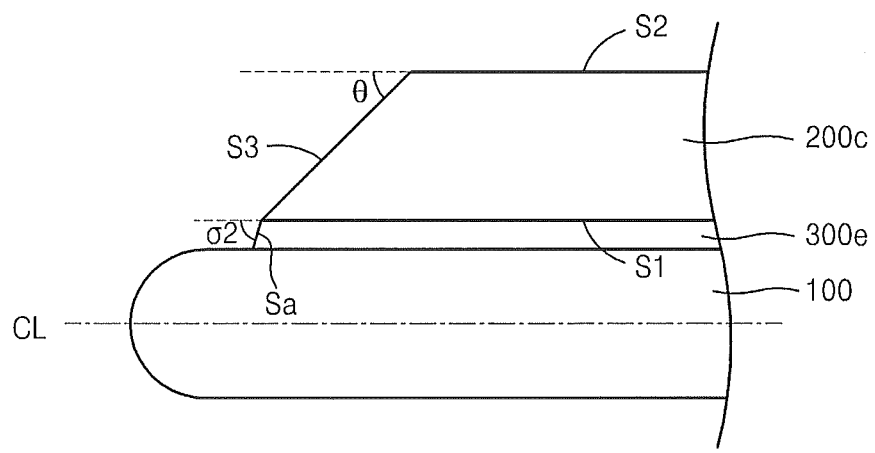

Referring to FIG. 7C, the first external angle θ between the cut side S3 and the back surface S2 of the device wafer 200c may be different from a third external angle σ2 between the cut side Sa of the adhesive 300e and the back surface S2 of the device wafer 200c. For example, the first external angle θ may be smaller than the third external angle σ2.

To control contamination due to the adhesive 300e during the grinding process and subsequent processes, a protruding portion of the adhesive 300e may be minimized or reduced by increasing the third external angle σ2. In some embodiments, the cutting may not be performed on the edge of the carrier wafer 100.

Figure 7D:
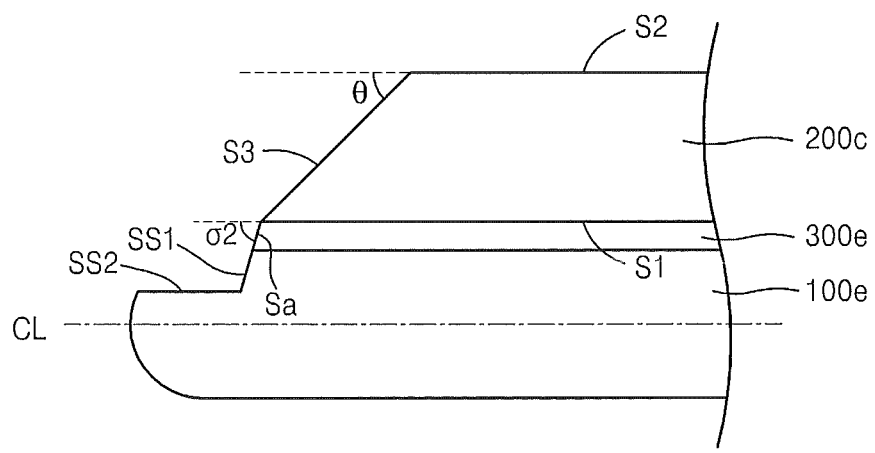

Referring to FIG. 7D, a cutting process may be similar to FIG. 7C except in that the edge of the carrier wafer 100e may be cut. The carrier wafer 100e may include the edge side SS1 and the edge plane SS2 as in FIG. 6C.

The edge side SS1 may be on the same plane as the cut side Sa of the adhesive 300e. That is, an external angle between the edge side SS1 and the back surface S2 of the device wafer 200c may be the third external angle σ2. The third external angle σ2 may be greater than the first external angle θ, and thus if the edge of the carrier wafer 100e is cut at the third external angle σ2, a part below the center line CL of the carrier wafer 100e may be also cut. Accordingly, a size the horizontal sectional area of the carrier wafer 100e may decrease. Thus, only the edge over the center line CL may be cut at the third external angle σ2, to reduce or avoid a decrease of the size of the carrier wafer 100e.

Although FIGS. 3A, 3B, 6A to 6D, and 7A to 7D have illustrated various inclined cutting structures of the edges of the carrier wafer, the adhesive, and the device wafer, the technical spirit of the present inventive concepts is not limited to the inclined cutting structures described herein. Different structures and processes may be possible according to the present inventive concepts.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A wafer processing method comprising:
attaching a first wafer to a second wafer using an adhesive extending between the first wafer and the second wafer, a front surface of the first wafer facing the second wafer;
cutting respective edges of the first wafer, the adhesive and the second wafer at a predetermined angle with respect to a back surface of the first wafer opposite the front surface of the first wafer, a cut side of the first wafer comprising a sloped side and a width of the first wafer monotonically decreasing from the front surface of the first wafer to the back surface of the first wafer; and then
grinding the back surface of the first wafer.

2. The method of claim 1, wherein the predetermined angle is in a range of about 35° to about 45°.

3. The method of claim 1, wherein cutting the edges of the first wafer, the adhesive and the second wafer comprises cutting an edge only in an upper half of the second wafer.

4. The method of claim 1, wherein cutting the edges of the first wafer, the adhesive and the second wafer comprises cutting the edge of the first wafer to reduce a diameter of the back surface of the first wafer by at least about 1,000 μm.

5. The method of claim 1, further comprising:
disposing wires on the back surface of the first wafer and arranging bumps on the respective wires after grinding the back surface of the first wafer; and
separating the first wafer from the adhesive after arranging the bumps.

6. The method of claim 1, wherein the width of the first wafer is less than a width of the second wafer.

7. The method of claim 1, wherein the cut side of the first wafer and a cut side of the adhesive are on an equal plane.

8. The method of claim 1, further comprising separating the first wafer from the adhesive after grinding the back surface of the first wafer.

9. The method of claim 1, wherein the second wafer comprises a first surface facing the first wafer, a second surface opposite the first surface and a side connecting the first surface and the second surface, and
wherein the adhesive exposes the side and the second surface of the second wafer.

10. The method of claim 1, wherein the first wafer comprises integrated circuits on the front surface.

11. A wafer processing method comprising:
attaching a device wafer to a carrier wafer using an adhesive, the device wafer comprising integrated circuits on a front surface thereof and the front surface of the device wafer facing the carrier wafer;
cutting respective edges of the adhesive and the device wafer at an angle with respect to a back surface of the device wafer opposite the front surface of the device wafer, wherein an external angle between the back surface of the device wafer and a cut side of the device wafer is in a range of about 35° to about 45°, and wherein a portion of the adhesive adjacent the carrier wafer has a width that is equal to or greater than a width of a portion of the device wafer adjacent the adhesive; and then
grinding the back surface of the device wafer.

12. The method of claim 11, wherein cutting the edges of the adhesive and the device wafer further comprises cutting an edge of the carrier wafer, and wherein a cut side of the carrier wafer has an angle different from an angle of the cut side of the device wafer.

13. The method of claim 11, wherein cutting the edges of the adhesive and the device wafer comprises cutting the edge of the device wafer to reduce a diameter of the back surface of the device wafer by at least about 1,000 μm, and
wherein grinding the back surface of the device wafer comprises grinding the device wafer until a thickness of the device wafer becomes equal to or less than about 100 μm.

14. A wafer processing method comprising:
removing an edge of a wafer assembly comprising a carrier wafer, a device wafer and an adhesive between the carrier wafer and the device wafer, wherein removing the edge of the wafer assembly comprises removing respective edges of the device wafer and the adhesive, making a width of the device wafer smaller than a width of the carrier wafer and forming a slope in a cut side of the device wafer, and wherein the device wafer comprises a first surface including integrated circuits thereon and facing the carrier wafer and a second surface opposite the first surface;

grinding the second surface of the device wafer after removing the edge of the wafer assembly; and separating the device wafer from the adhesive after grinding the second surface of the device wafer.

15. The wafer processing method of claim 14, wherein the adhesive comprises ultraviolet (UV) cure resin, UV cure resist, thermoset resin, thermoplastic resin, paste resin, ceramic, polydimethylsiloxane (PDMS), polar solvent N-methylpyrrolidone (NMP), propylene glycol methyl ether acetate (PGMEA) or butyrolactone (BLO).

16. The wafer processing method of claim 14, wherein the slope comprises a first slope and removing the edge of the wafer assembly forms a second slope in a cut side of the adhesive, and wherein the first slope comprises a first angle different from a second angle of the second slope.

17. The wafer processing method of claim 14, wherein the slope comprises an angle in a range of about 35° to about 45°.

18. The wafer processing method of claim 14, wherein the width of the device wafer monotonically decreases from the first surface of the device wafer to the second surface of the device wafer.

19. The method of claim 11, wherein the width of the portion of the device wafer adjacent the adhesive is less than a width of the carrier wafer.

20. The method of claim 11, further comprising separating the device wafer from the adhesive after grinding the back surface of the device wafer.

* * * * *